United States Patent
Li

(10) Patent No.: US 7,710,214 B2
(45) Date of Patent: May 4, 2010

(54) PULSE WIDTH MODULATION STRUCTURE ENABLING REGULATED DUTY CYCLE

(75) Inventor: Ching-Sheng Li, Sinjhuang (TW)

(73) Assignee: Anpec Electronics Corporation, Hsinchu (TW)

( * ) Notice: Subject to any disclaimer, the term of this patent is extended or adjusted under 35 U.S.C. 154(b) by 48 days.

(21) Appl. No.: 12/047,881

(22) Filed: Mar. 13, 2008

(65) Prior Publication Data
US 2009/0231052 A1  Sep. 17, 2009

(51) Int. Cl.
  *H03K 7/08* (2006.01)
(52) U.S. Cl. .................... 332/109; 327/172; 327/175
(58) Field of Classification Search ......... 332/109–111; 327/172–177; 375/238; 388/804, 829
  See application file for complete search history.

(56) References Cited
U.S. PATENT DOCUMENTS 4,823,056 A * 4/1989 Watanabe et al. ........... 388/829
5,606,296 A    2/1997 Seong
6,201,414 B1   3/2001 Yazdy

* cited by examiner

*Primary Examiner*—David Mis

(57) ABSTRACT

A pulse width modulation (PWM) structure enabling regulated duty cycle includes a DC power supply unit, a signal generating unit, a voltage-dividing resistor unit, a reference voltage unit, and a comparing unit. When the DC power supply unit supplies a voltage signal to the voltage-dividing resistor unit, the latter receives the voltage signal and sets voltage levels before sending the voltage signal to the signal generating unit, so that a waveform signal generated by the signal generating unit regulates its voltage levels according to the received voltage signal before sending the waveform signal to the comparing unit. The comparing unit receives and compares the signals from the signal generating unit and the reference voltage unit, and outputs a comparison signal for driving a fan motor to operate, so that the finally output signal is substantially linear and smooth.

7 Claims, 10 Drawing Sheets

PULSE WIDTH MODULATION STRUCTURE ENABLING REGULATED DUTY CYCLE

FIELD OF THE INVENTION

The present invention relates to a pulse width modulation (PWM) structure, and more particularly to a PWM structure enabling regulated duty cycle.

BACKGROUND OF THE INVENTION

The pulse width modulation (PWM) is a very effective technique for controlling an analog circuit utilizing digital output of a microprocessor, and is widely applied in many different fields from measuring, communication, to power control and conversion.

Please refer to FIGS. 1, 2 and 3A, which shows a conventional PWM circuit applied to a fan motor (not shown). The PWM circuit includes a direct current (DC) power supply unit 110, a voltage-dividing resistor unit 120, a comparing unit 130, and a signal generating unit 140.

The DC power supply unit 110 is a variable DC voltage source Vin of 2 to 5 volts, for example, for supplying a voltage source to the voltage-dividing resistor unit 120.

The voltage-dividing resistor unit 120 includes a first resistor element R7 and a second resistor element R8, and a first node voltage Vr coupled to and between the first and the second resistor element R7 and R8. The voltage-dividing resistor unit 120 has a voltage value that varies with the voltage value supplied by the DC power supply unit 110.

The signal generating unit 140 may be a triangular-wave generator 141 for generating a triangular-wave signal. The triangular-wave signal has fixed high level VH and low level LV, which do not vary with changes in the voltage value of the DC power supply unit 110.

The comparing unit 130 may be a comparator 131 for receiving and comparing the signals from the signal generating 140 and the voltage-dividing resistor unit 120, and outputting a pulse width modulated (PWM) signal.

When the variable DC power source Vin supplies a voltage source of 2 to 5 volts, for example, to the voltage-dividing resistor unit 120, the latter calculates using a formula based on the voltage-divider theorem to derive the voltage signal to be sent to the comparing unit 130. Meanwhile, when the triangular-wave signal generated by the signal generating unit 140 is also sent to the comparing unit 130, the comparing unit 130 compares the voltage signal and the triangular-wave signal and outputs a PWM signal to drive the fan motor (not shown) to operate. FIG. 2 is a voltage-speed curve for the conventional PWM circuit of FIG. 1. As can be clearly seen from FIG. 2, the voltage-speed curve T1 is a non-smooth curve including a breaking point P.

Please refer to FIGS. 3A, 3B, and 3C, which are applied circuit diagram, waveform graph, and duty cycle-voltage curve for an embodiment of the conventional PWM circuit of FIG. 1. It is already known that the high level HV and the low level LV of the triangular-wave generator 141 is set to 2V and 1V, respectively, and the first resistor element R7 is set to 10KΩ. Given that the duty cycle of the PWM signal is 50% and the variable DC voltage source Vin is 2V; then, the first node voltage Vr may be calculated using the following formula:

$$50\% = \frac{VH - Vr}{VH - VL} = \frac{2 - Vr}{2 - 1} \Rightarrow Vr = 1.5 \text{ V}$$

-continued $$Vr = Vin \times \frac{R8}{(R7 + R8)} \Rightarrow 1.5 = 2 \times \frac{R8}{(10K + R8)} \Rightarrow R8 = 30\text{K}\Omega$$

From the above calculations, it is derived that the first node voltage Vr is 1.5V, and the second resistor element R8 is 30KΩ.

Alternatively, given that the duty cycle of the PWM signal is 100%, and the variable DC voltage source Vin is 5V; then, the first node voltage Vr may be derived using the following formula:

$$Vr = Vin \times \frac{R8}{(R7 + R8)} \Rightarrow Vr = 5 \times \frac{30K}{10K + 30K} \Rightarrow Vr = 3.75 \text{ V}$$

Therefore, when the variable DC voltage source Vin is 5V, the first node voltage Vr is 3.75V. On the other hand, given that when the first node voltage is 2V to just reach the high level VH, then the variable DC voltage source Vin may be calculated using the following formula:

$$Vr = Vin \times \frac{R8}{(R7 + R8)} \Rightarrow 2 = Vin \times \frac{30K}{(10K + 30K)} \Rightarrow Vin = 2.67 \text{ V}$$

FIG. 3C is a duty cycle-voltage curve plotted according to the values obtained from the above calculations. As can be seen from FIG. 3C, the duty cycle-voltage curve D1 starts extending upward at a point corresponding to the duty cycle of 50% and the variable DC voltage source Vin of 2V until the curve reaches the point corresponding to the variable DC voltage source Vin of 2.67V. Then, the duty cycle-voltage curve D1 stably extends horizontally until it reaches the point corresponding to the variable DC voltage source Vin of 5V. As can be clearly seen from FIG. 3C, the duty cycle-voltage curve D1 is a non-smooth curve.

Therefore, the conventional PWM circuit has the following disadvantages: (1) it has a non-smooth duty cycle-voltage curve, which makes the conventional PWM circuit unstable; and (2) it has a non-smooth voltage-speed curve, which makes the conventional PWM circuit unstable.

It is therefore tried by the inventor to develop an improved PWM structure to overcome the problems existed in the conventional PWM circuit.

SUMMARY OF THE INVENTION

A primary object of the present invention is to provide a pulse width modulation (PWM) structure enabling regulated duty cycle.

To achieve the above and other objects, the PWM structure enabling regulated duty cycle according to the present invention includes a DC power supply unit for supplying a voltage source and generating a voltage signal; a signal generating unit for generating a waveform signal; a voltage-dividing resistor unit for setting voltage levels for the signal generating unit; a reference voltage unit that can set a voltage value from an external circuit or an internal circuit and the set voltage value does not vary with changes in the voltage value supplied by the DC power supply unit; and a comparing unit for receiving and comparing signals from the signal generating unit and the reference voltage unit and outputting a comparison signal.

When the DC power supply unit sends a voltage signal to the voltage-dividing resistor unit, the latter receives the voltage signal and sets voltage levels before sending the voltage signal to the signal generating unit, so that the waveform signal generated by the signal generating unit regulates the voltage levels thereof according to the received voltage signal. The comparing unit compares the signals received from the signal generating unit and the reference voltage unit and outputs a comparison signal to drive a fan motor to operate, so that the pulse width modulated signal has a substantially linear smooth duty cycle-voltage curve.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
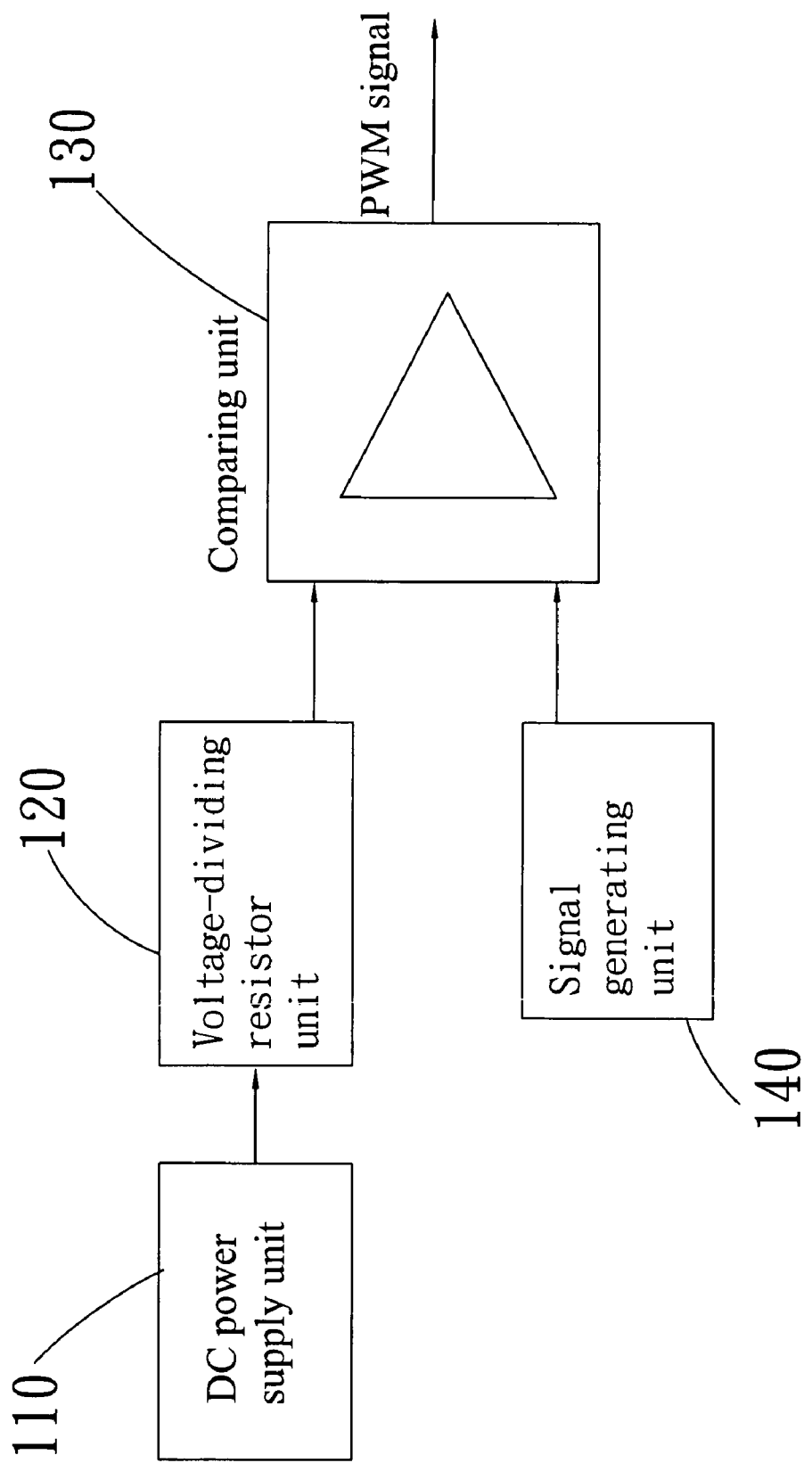
FIG. 1 is a block diagram of a conventional PWM circuit.
Figure 2:
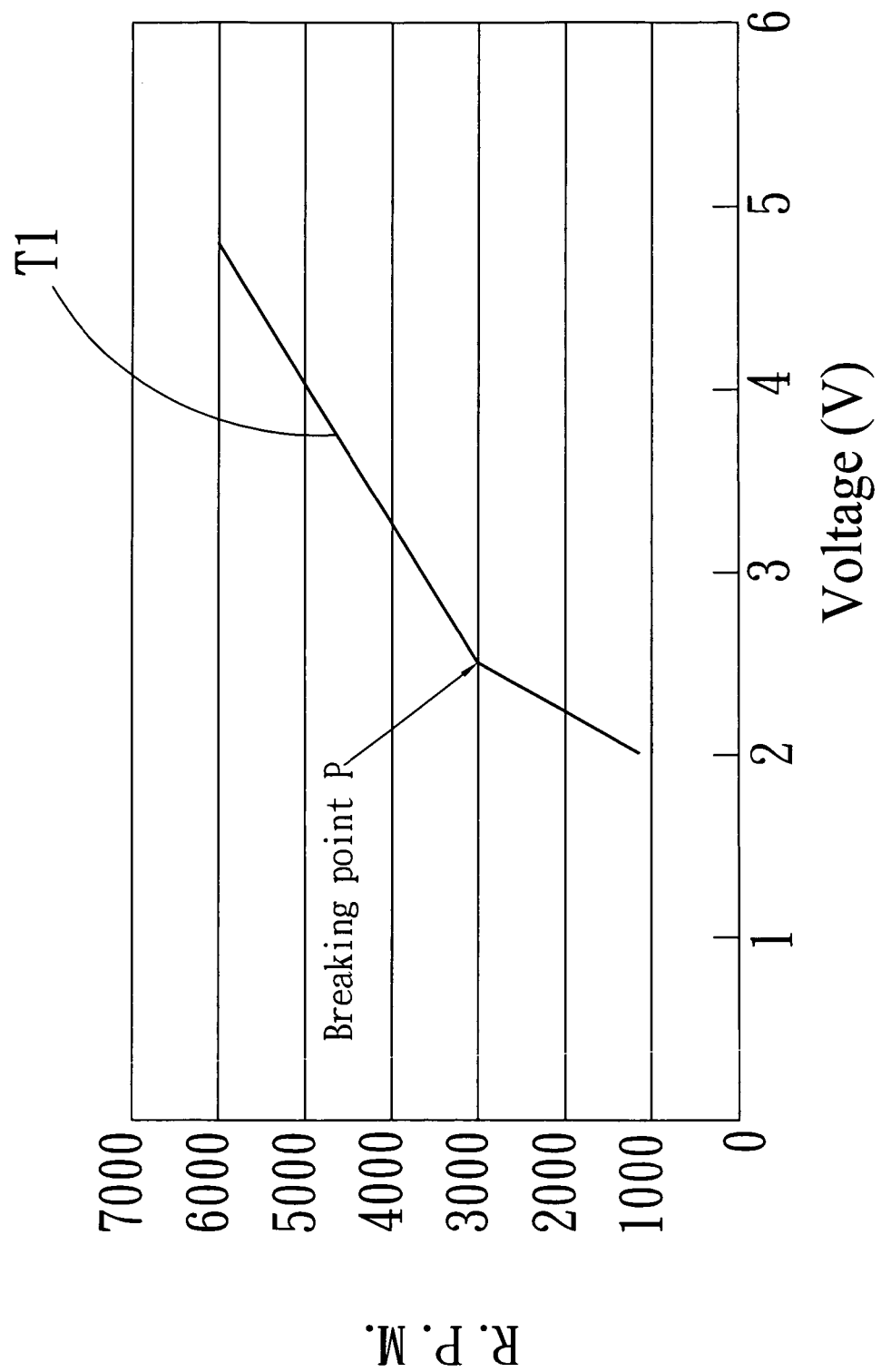
FIG. 2 is a voltage-speed curve for the conventional PWM circuit of FIG. 1.
Figure 3A:
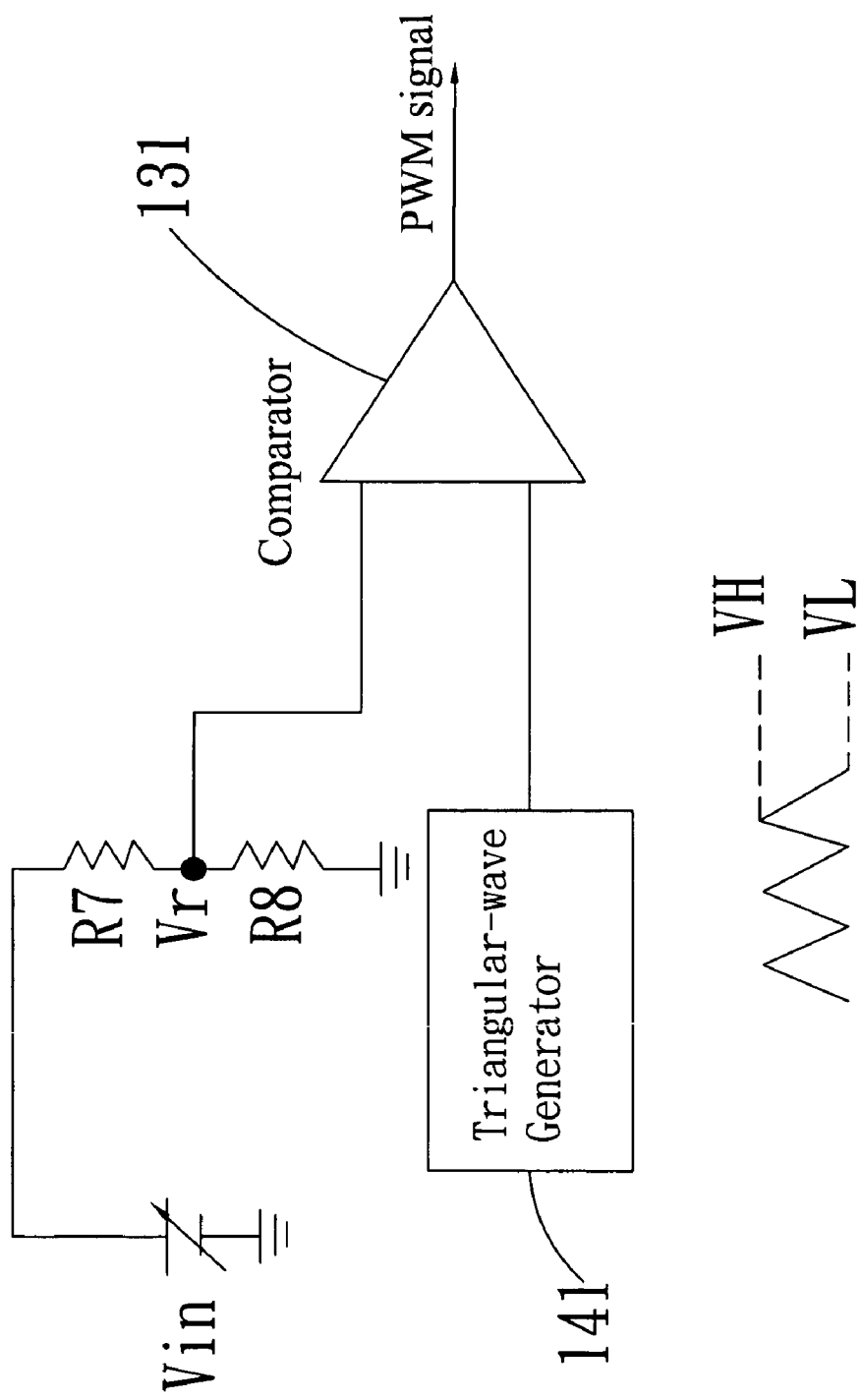
FIG. 3A is an applied circuit diagram for an embodiment of the conventional PWM circuit of FIG. 1.
Figure 3B:
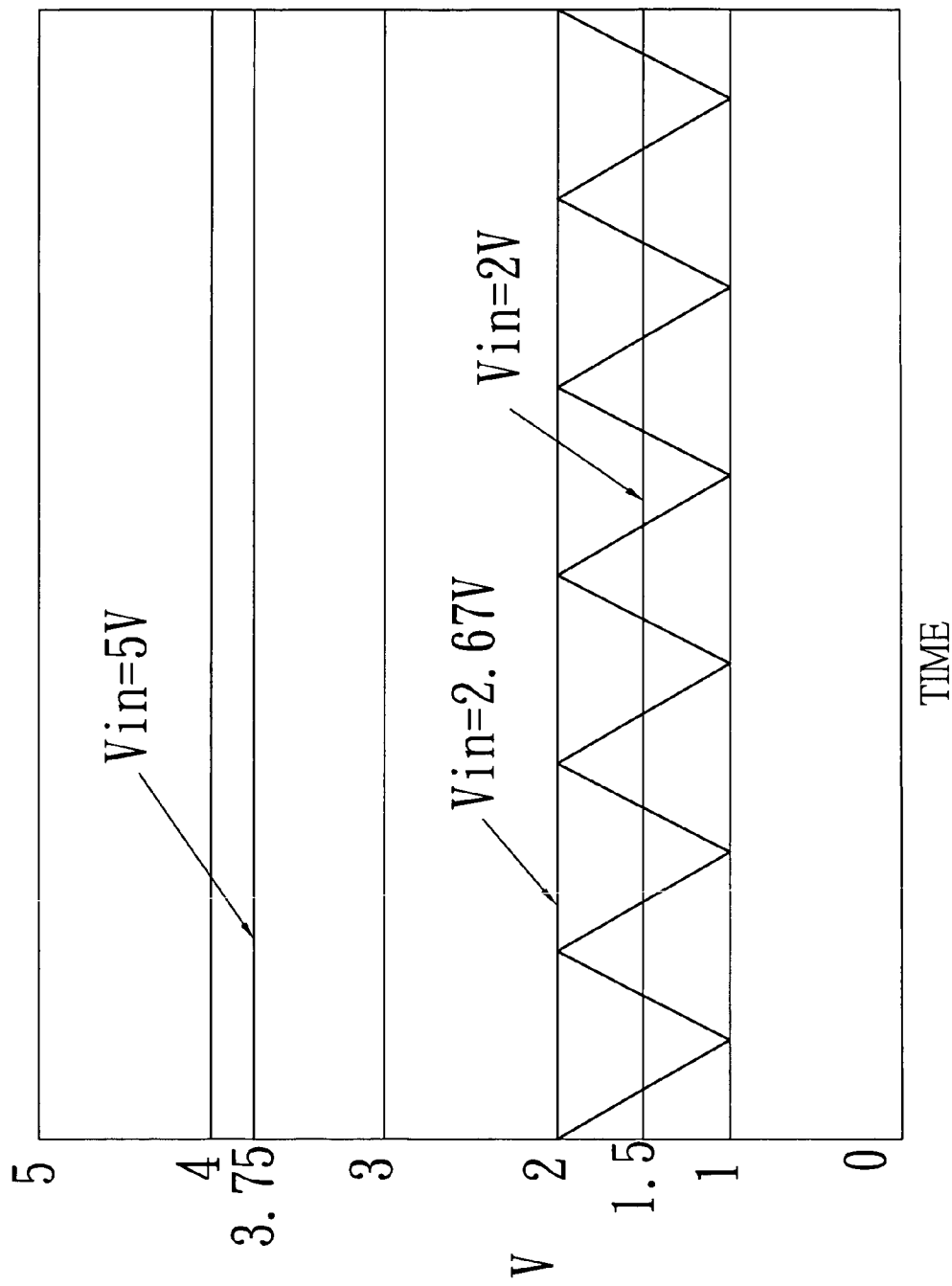
FIG. 3B is an applied waveform graph for the conventional PWM circuit of FIG. 3A.
Figure 3C:
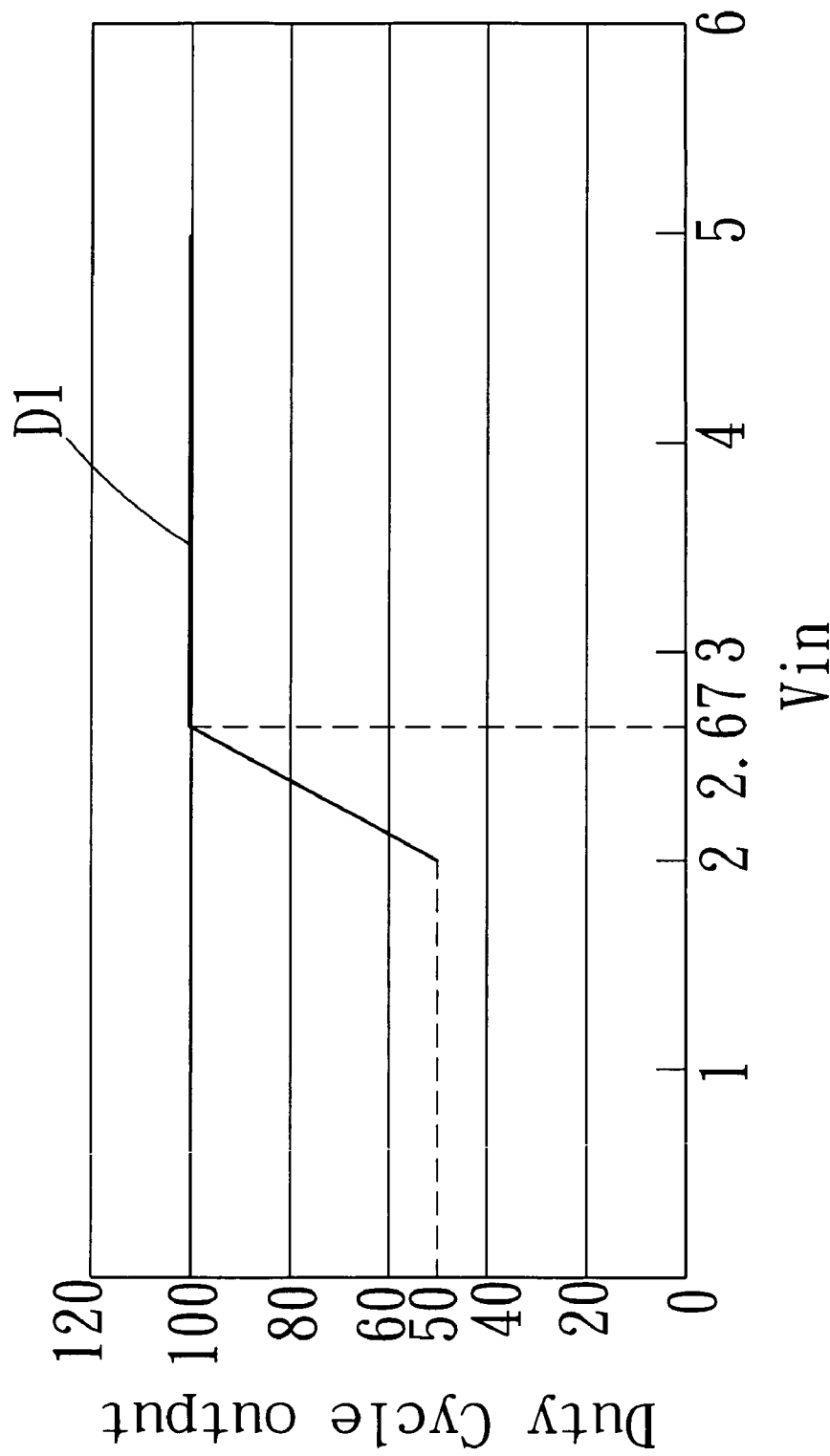
FIG. 3C is a duty cycle-voltage curve for the conventional PWM circuit of FIG. 3A.
Figure 4:
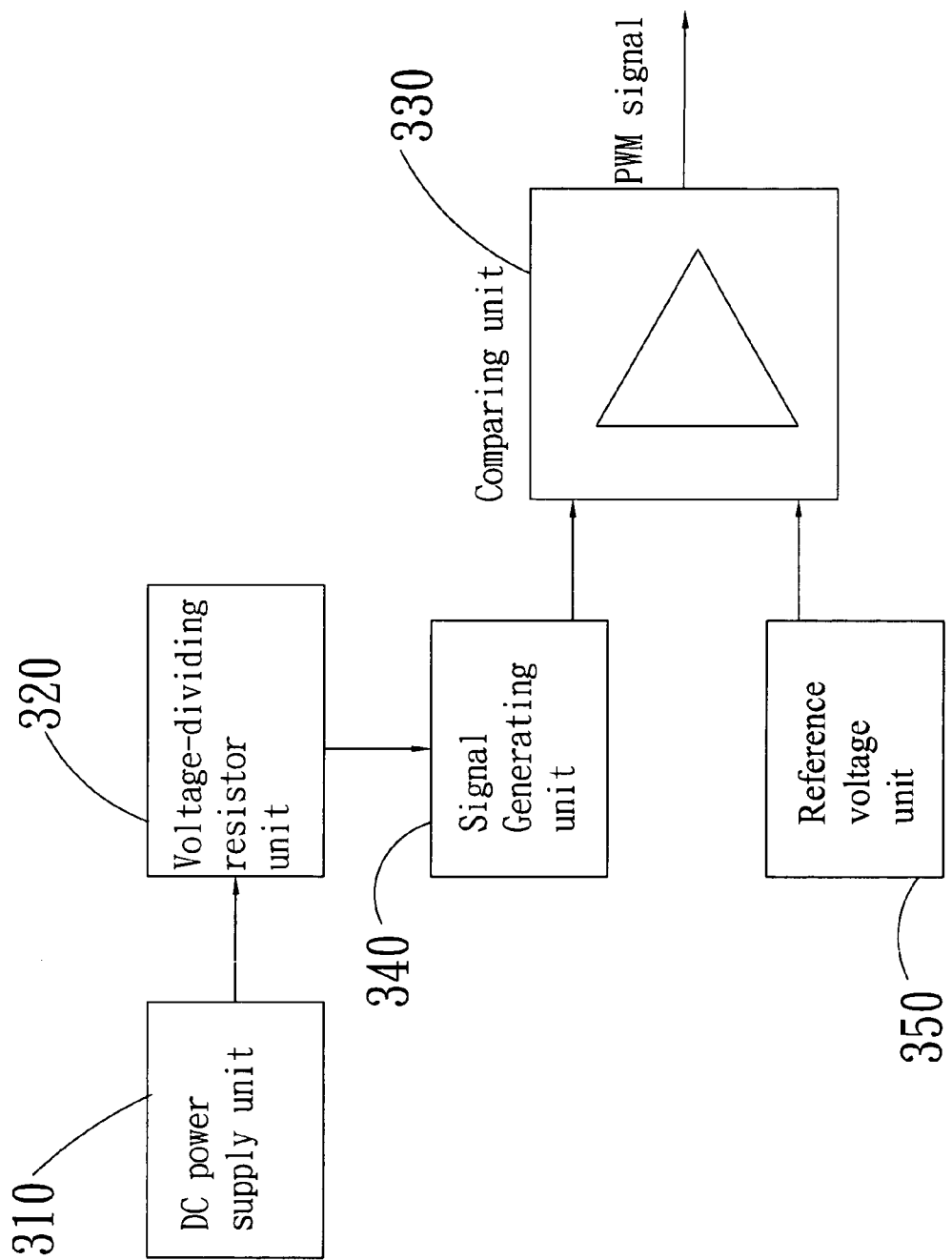
FIG. 4 is a block diagram of a PWM structure according to a preferred embodiment of the present invention.

The present invention relates to a pulse width modulation (PWM) structure enabling regulated duty cycle for applying to a fan motor (not shown). As car, be seen from the block diagram in FIG. 4, a PWM structure according to a preferred embodiment of the present invention includes a DC power supply unit 310, a voltage-dividing resistor unit 320, a comparing unit 330, a signal generating unit 340, and a reference voltage unit 350.

The DC power supply unit 310 supplies a voltage source and generates a voltage signal. The voltage-dividing resistor unit 320 sets voltage levels for the signal generating unit 340. The signal generating unit 340 is able to generate a triangular-wave signal or a toothed-wave signal. The reference voltage unit 350 may set a voltage value via an external circuit or an internal circuit, and the set voltage value does not vary with changes in the voltage source supplied by the DC power supply unit 310. The comparing unit 330 receives and compares signals from the signal generating unit 340 and the reference voltage unit 350, and outputs a comparison signal, which may be a PWM signal.

Figure 5:
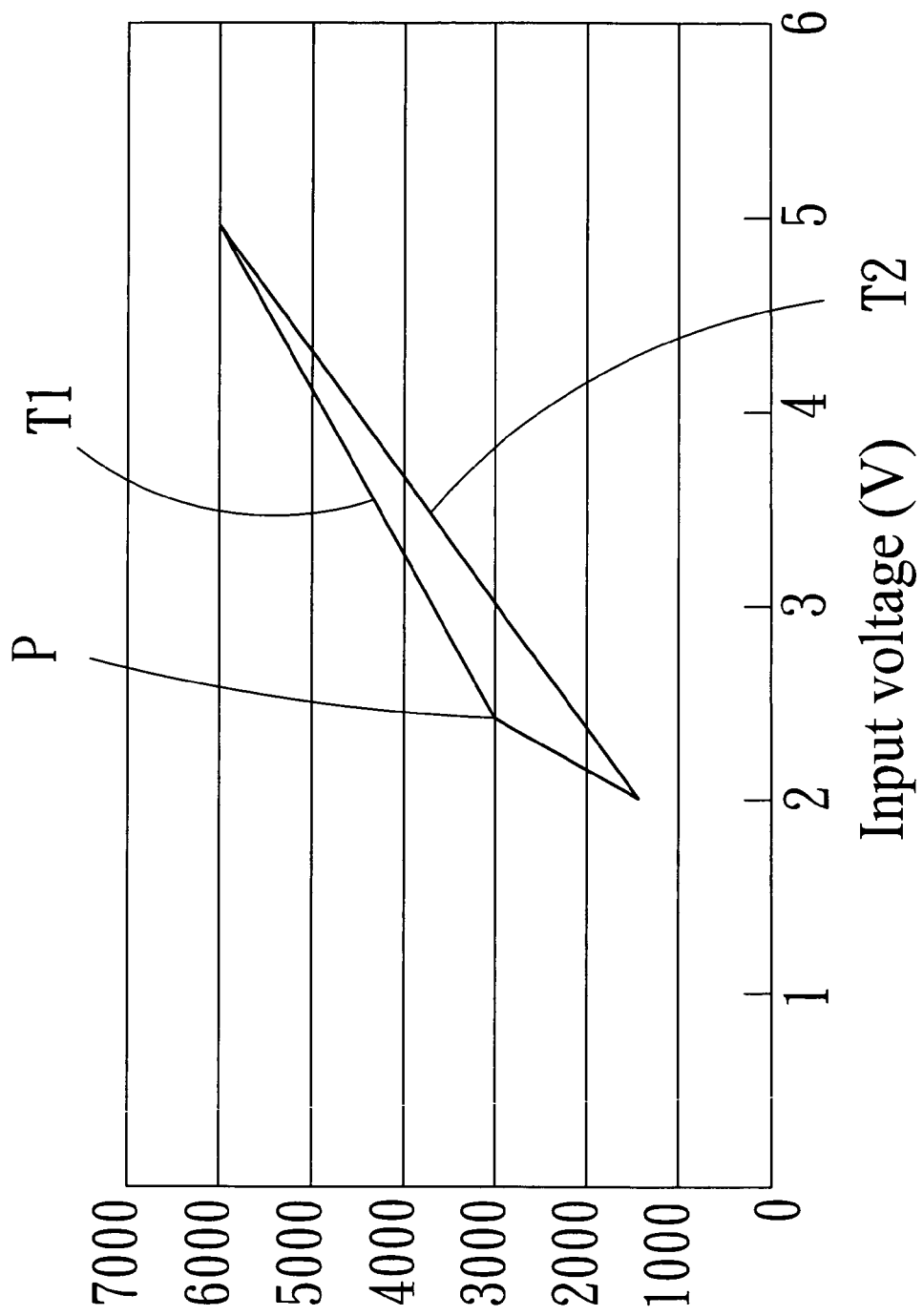
FIG. 5 is a voltage-speed curve of the PWM signal output by the PWM structure of FIG. 4.

When the DC power supply unit 310 sends the voltage signal to the voltage-dividing resistor unit 320, the voltage-dividing resistor unit 320 receives the voltage signal and sets voltage levels, and then sends the voltage signal to the signal generating unit 340, so that the triangular-wave signal or the toothed-wave signal generated by the signal generating unit 340 regulates the voltage levels thereof according to the received voltage signal. The comparing unit 330 compares the signals received from the signal generating unit 340 and the reference voltage unit 350 to output a PWM signal to drive the fan motor to operate, so that the finally output PWM signal is substantially linear and smooth. FIG. 5 shows a voltage-speed curve T2 of the PWM signal output by the PWM structure according to the preferred embodiment of the present invention. As can be clearly seen from FIG. 5, the voltage-speed curve T2 does not include any breaking point and is obviously smoother than the voltage-speed curve T1 of the conventional PWM circuit. That is, the voltage-speed curve T2 is a substantially linear smooth curve.

Figure 6A:
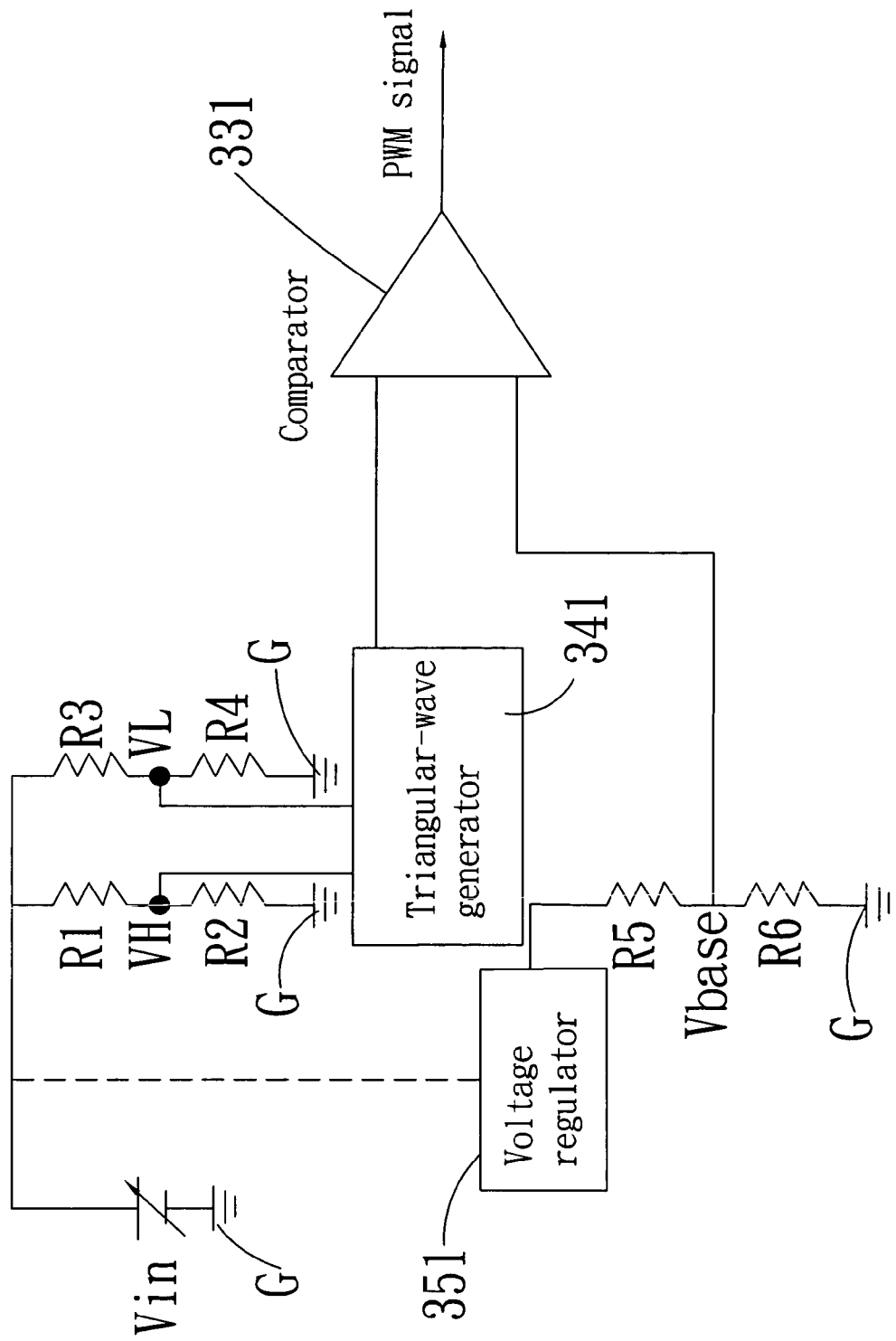
FIG. 6A is an applied circuit diagram of the preferred embodiment of the present invention.

FIG. 6A is an applied circuit diagram of the preferred embodiment of the present invention. As shown, the DC power supply unit 310 may be a variable voltage source Vin. The voltage-dividing resistor unit 320 includes a first resistor element R1, a second resistor element R2, a third resistor element R3, and a fourth resistor element R4. The first resistor element R1 is coupled at an end with the variable voltage source Vin and an end of the third resistor element R3, and at the other end with an end of the second resistor element R2. The second resistor element R2 is connected at the other end to a ground G. The fourth resistor element R4 is coupled at an end with the other end of the third resistor element R3, and connected at the other end to the ground G. A first node voltage VH is coupled with and between the first resistor element R1 and the second resistor element R2, and a second node voltage VL is coupled with and between the third resistor element R3 and the fourth resistor element R4.

The signal generating unit 340 may be a triangular-wave generator 341, which is coupled with the first node voltage VH and the second node voltage VL. Wherein, the first node voltage VH and the second node voltage VL respectively set a high level and a low level of the triangular-wave generator 341. The reference voltage unit 350 includes a voltage regulator 351, a fifth resistor element R5, and a sixth resistor element R6. The voltage regulator 351 is coupled with the variable DC voltage source Vin and an end of the fifth resistor element R5; the sixth resistor element R6 is coupled at an end with the other end of the fifth resistor element R5 and connected at the other end to a ground G; and a third node voltage Vbase is coupled with and between the fifth resistor element R5 and the sixth resistor element R6. The comparing unit 330 may be a comparator 331 coupled with the triangular-wave generator 341 and the third node voltage Vbase.

Moreover, the first, the second, the third, the fourth, the fifth, and the sixth resistor element R1, R2, R3, R4, R5, and R6 may be selected from the group consisting of a wire-wound resistor, a metal film resistor, an alloy membrane resistor, a metal oxide film resistor, a carbon film resistor, a carbon solid resistor, and a cement resistor.

Figure 6B:
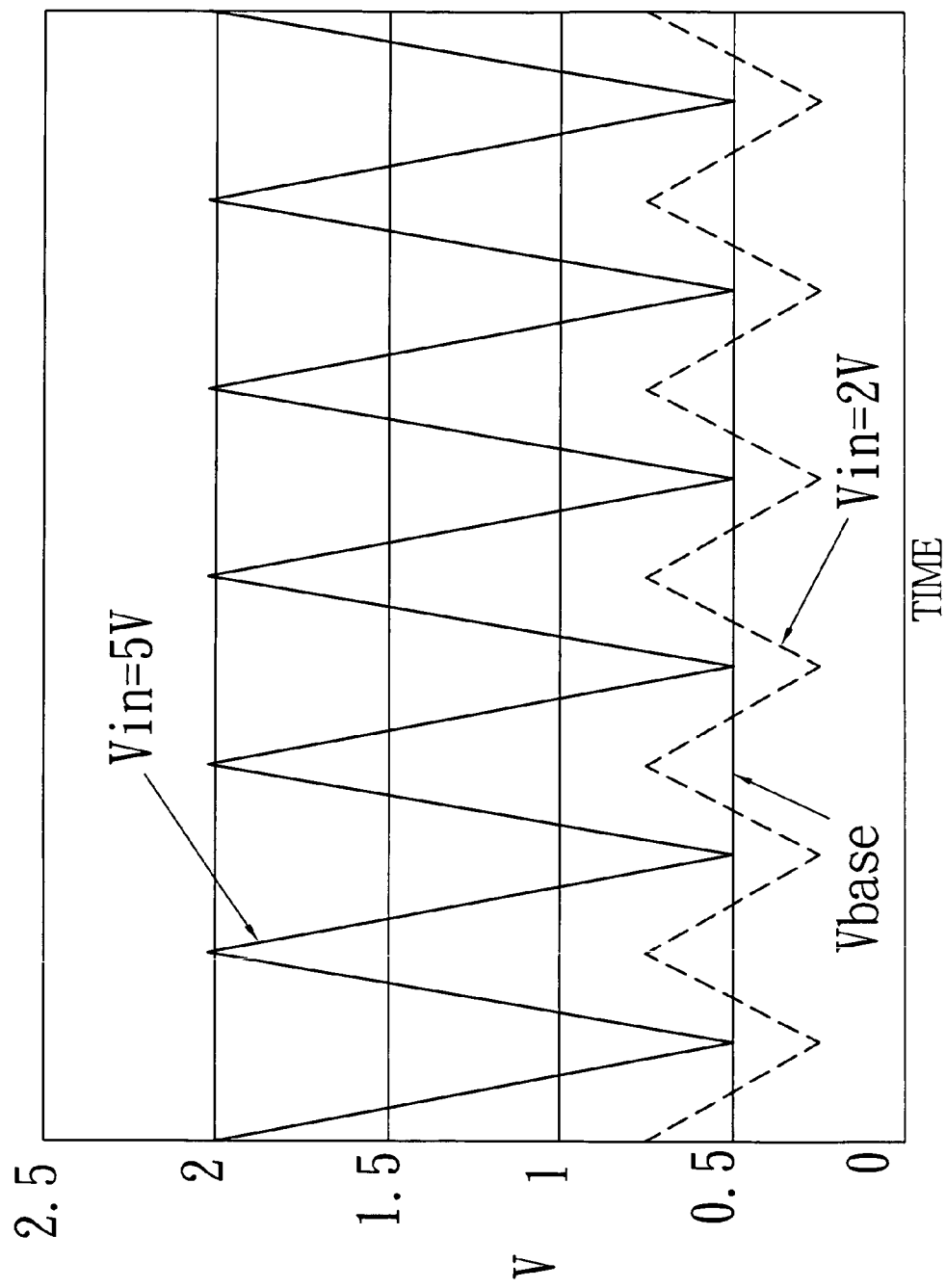
FIG. 6B is an applied waveform graph for the PWM structure of FIG. 6A.

The use and the operation of the PWM structure enabling regulated duty cycle according to the present invention will now be described based on the above-mentioned structural design. Please refer to FIGS. 6A, 6B, and 6C. It is already known that the third node voltage Vbase is set to 0.5V, and the first resistor element R1 and the third resistor element R3 are set to 10KΩ. If the duty cycle is 100% and the variable voltage source Vin is 5V, then the second node voltage VL must be 0.5V, and the fourth resistor element R4 may be calculated using the following formula based on the voltage-divider theorem:

$$VL = Vin \times \frac{R4}{(R3+R4)} \Rightarrow 0.5 = 5 \times \frac{R4}{10K+R4} \Rightarrow R4 = 1.02K\Omega$$

From the above calculation, it is derived the fourth resistor element R4 is 1.02KΩ.

Alternatively, if the duty cycle is 50%, and the variable voltage source Vin is 2V, then the first node voltage VH and the second node voltage VL, and the second resistor element R2 may be calculated using the formula based the voltage-divider theorem and the duty-cycle formula as follows:

$$VL = Vin \times \frac{R4}{(R3+R4)} \Rightarrow VL = 2 \times \frac{1.02K}{10K+1.02K} \Rightarrow VL = 0.185 \text{ V}$$

$$50\% = \frac{(VH - Vbase)}{(VH - VL)} \Rightarrow 0.5 = \frac{(VH - 0.5)}{(VH - 0.185)} \Rightarrow VH = 0.815 \text{ V}$$

$$VH = Vin \times \frac{R2}{(R1+R2)} \Rightarrow 0.815 = 2 \times \frac{R2}{10K+R2} \Rightarrow R2 = 6.88K\Omega$$

From the above calculations, it is derived the first node voltage VH is 0.815V, the second node voltage VL is 0.185V, and the second resistor element R2 is 6.88KΩ. Further, when the duty cycle is 100% and the variable voltage source Vin is 5V, the first node voltage VH may also be calculated using the following formula based on the voltage-divider theorem:

$$VH = Vin \times \frac{R2}{(R1+R2)} \Rightarrow VH = 5 \times \frac{6.88K}{10K+6.88K} \Rightarrow VH = 2.04 \text{ V}$$

Therefore, when the variable voltage source Vin is 5V, the first node voltage VH is 2.04V.

Figure 6C:
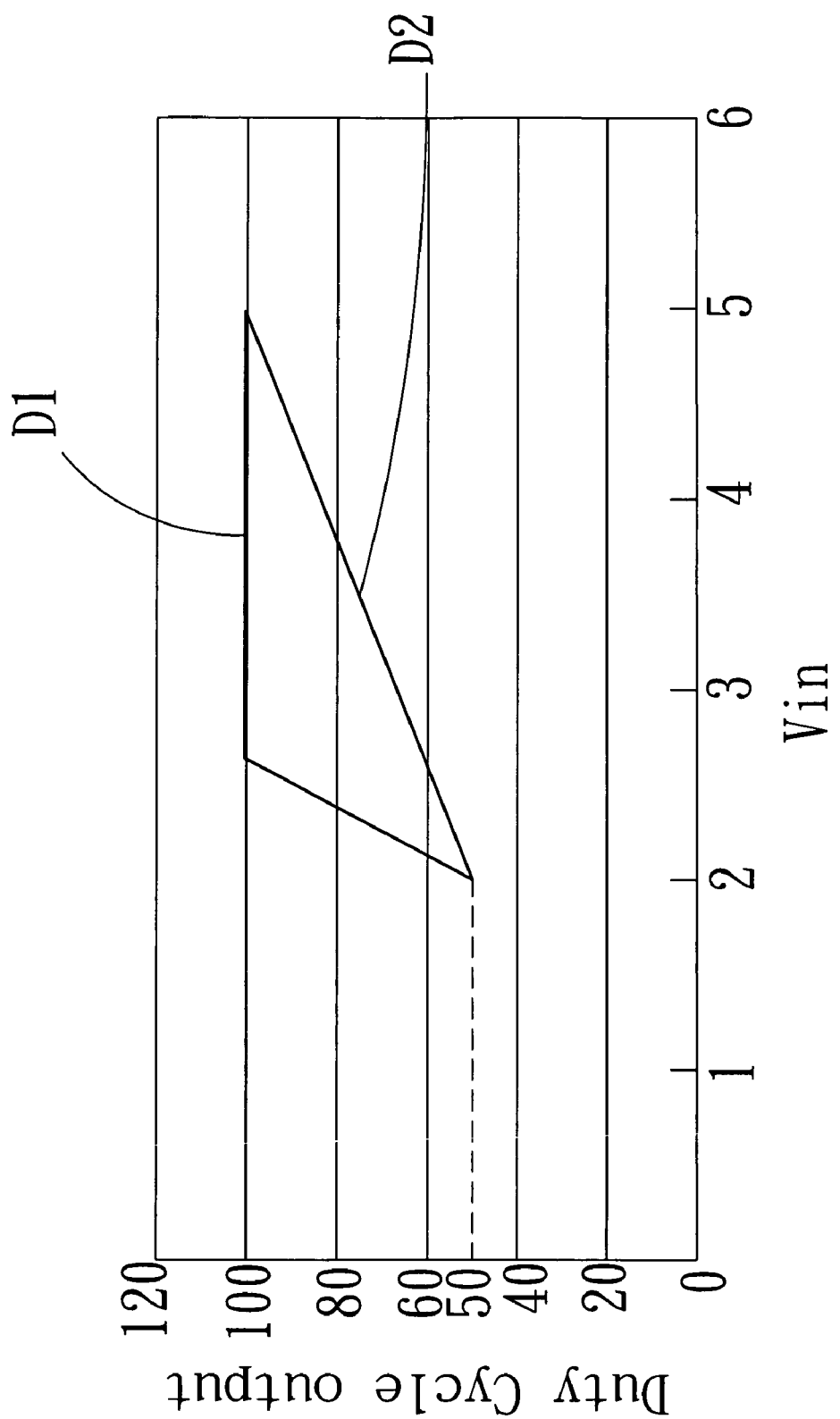
FIG. 6C is a duty cycle-voltage curve for the PWM structure of FIG. 6A.

FIG. 6C shows the duty cycle-voltage curve D2 for the PWM structure of the present invention drawn based on the values obtained from the above calculations. As shown, the duty cycle-voltage curve D2 starts extending upward from a point corresponding to the duty cycle of 50% and the variable voltage source Vin of 2V, and keeps rising until it reaches at a point corresponding to the duty cycle of 100% and the variable voltage source Vin of 5V. The duty cycle-voltage curve D2 is smooth without any breaking point, compared to the duty cycle-voltage curve D1 for the conventional PWM circuit. Therefore, the PWM signal output by the PWM structure of the present invention is substantially linear and smooth.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A pulse width modulation (PWM) structure enabling regulated duty cycle, comprising:
    a DC power supply unit for supplying a voltage source and generating a voltage signal;
    a signal generating unit for generating a waveform signal;
    a voltage-dividing resistor unit for setting voltage levels for the signal generating unit;
    a reference voltage unit having a voltage regulator, a fifth resistor element, and a sixth resistor element for setting a voltage value from an external circuit or an internal circuit; and
    a comparing unit for receiving and comparing signals from the signal generating unit and the reference voltage unit, and outputting a comparison signal;
    whereby when the DC power supply unit sends a voltage signal to the voltage-dividing resistor unit, the latter receives the voltage signal and sets voltage levels, so that the waveform signal generated by the signal generating unit regulates voltage levels thereof according to the received voltage signal before sending the waveform signal to the comparing unit; and the comparing unit compares the signals received from the signal generating unit and the reference voltage unit and outputs a comparison signal, so that the finally output signal is substantially linear and smooth.

2. The PWM structure enabling regulated duty cycle as claimed in claim 1, wherein the DC power supply unit is a variable voltage source.

3. The PWM structure enabling regulated duty cycle as claimed in claim 1, wherein the voltage-dividing resistor unit includes a first, a second, a third, and a fourth resistor element.

4. The PWM structure enabling regulated duty cycle as claimed in claim 1, wherein the signal generating unit is a triangular-wave generator.

5. The PWM structure enabling regulated duty cycle as claimed in claim 1, wherein the comparing unit is a comparator.

6. The PWM structure enabling regulated duty cycle as claimed in claim 3, wherein the first, the second, the third, and the fourth resistor element are selected from the group consisting of a wire-wound resistor, a metal film resistor, an alloy membrane resistor, a metal oxide film resistor, a carbon film resistor, a carbon solid resistor, and a cement resistor.

7. The PWM structure enabling regulated duty cycle as claimed in claim 1, wherein the fifth and the sixth resistor element are selected from the group consisting of a wire-wound resistor, a metal film resistor, an alloy membrane resistor, a metal oxide film resistor, a carbon film resistor, a carbon solid resistor, and a cement resistor.

* * * * *